(12) United States Patent
Lin

(10) Patent No.: US 6,900,101 B2
(45) Date of Patent: May 31, 2005

(54) LDMOS TRANSISTORS AND METHODS FOR MAKING THE SAME

(75) Inventor: John Lin, Chelmsford, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/461,214

(22) Filed: Jun. 13, 2003

(65) Prior Publication Data

US 2004/0251492 A1 Dec. 16, 2004

(51) Int. Cl.7 .......................................... H01L 21/8236
(52) U.S. Cl. ................. 438/276; 438/227; 438/297; 438/306; 438/519; 438/524; 257/E21.417
(58) Field of Search ................. 438/193, 227, 438/276, 297, 518, 519, 521, 524, 526, 529, 306, 307; 257/E21.417

(56) References Cited

U.S. PATENT DOCUMENTS

| | | | |
|---|---|---|---|
| 5,406,110 A | 4/1995 | Kwon et al. | |
| 5,501,994 A | 3/1996 | Mei | |
| 5,736,766 A | 4/1998 | Efland et al. | |
| 6,064,086 A | * 5/2000 | Nakagawa et al. | 257/335 |
| 6,071,768 A | 6/2000 | Duvvury et al. | |
| 6,211,552 B1 | 4/2001 | Efland et al. | |
| 6,225,673 B1 | 5/2001 | Pendharkar et al. | |
| 6,365,932 B1 | * 4/2002 | Kouno et al. | 257/341 |
| 6,372,586 B1 | 4/2002 | Efland et al. | |
| 6,424,005 B1 | 7/2002 | Tsai et al. | |
| 6,441,431 B1 | 8/2002 | Efland et al. | |
| 6,468,837 B1 | 10/2002 | Pendharkar et al. | |

* cited by examiner

Primary Examiner—George Fourson
Assistant Examiner—Thanh V. Pham
(74) Attorney, Agent, or Firm—Jacqueline J. Garner; W. James Brady, III; Frederick J. Telecky, Jr.

(57) ABSTRACT

LDMOS transistor devices and fabrication methods are provided, in which additional dopants are provided to region of a substrate near a thick dielectric between the channel and the drain to reduce device resistance without significantly impacting breakdown voltage. The extra dopants are added by implantation prior to formation of the thick dielectric, such as before oxidizing silicon in a LOCOS process or following trench formation and before filling the trench in an STI process.

12 Claims, 10 Drawing Sheets

LDMOS TRANSISTORS AND METHODS FOR MAKING THE SAME

FIELD OF INVENTION

The present invention relates generally to semiconductor devices and more particularly to extended-drain MOS transistor devices and fabrication methods for making the same.

BACKGROUND OF THE INVENTION

Power semiconductor products are often fabricated using extended-drain N or P channel transistors, such as lateral double-diffused metal-oxide-semiconductor (LDMOS) devices for high power switching applications. LDMOS devices advantageously combine short-channel operation with high current handling capabilities and are able to withstand large blocking voltages without suffering voltage breakdown failure. Accordingly, these devices are ideally suited for power switching applications, particularly where inductive loads are to be driven. N channel LDMOS transistors are asymmetrical devices in which a p-type channel region is typically formed in a p-well between an n-type source and an extended n-type drain. Low n-type doping on the drain side provides a large depletion layer with high blocking voltage. LDMOS devices often short the p-well to the source to prevent the p-well from floating, thereby stabilizing the device threshold voltage (Vt).

Solenoid driver integrated circuits and other output drivers often include one or more such LDMOS power transistor devices along with logic and other lower power analog circuitry, wherein the LDMOS transistors are used to provide control outputs to solenoids in automotive or other applications. LDMOS devices have certain performance advantages in such applications, such as relatively low Rdson and high blocking voltage capabilities. Thus, LDMOS devices have been widely used for integrated circuit output drivers requiring blocking voltages in the range of 20–60 volts, and current carrying capability in the range of about 1–3 amps or higher. In addition, LDMOS device fabrication is relatively easy to integrate into CMOS process flows. This allows easy integration in devices where logic, low power analog, or other circuitry is also to be fabricated in a single IC.

For LDMOS transistors designed for higher power applications, a particular design is often a tradeoff between breakdown voltage and on-state resistance (Rdson). Breakdown voltage is often measured as drain-to-source breakdown voltage with the gate and source shorted together (BVdss). Where high breakdown voltage is needed, LDMOS or other drain-extended MOS transistors are often employed, in which the drain region is spaced from the gate to provide a drift region or drain extension in the semiconductor material therebetween. The spacing of the drain and the gate spreads out the electric fields thereby increasing the breakdown voltage rating of the device. However, the drain extension increases the resistance of the drain-to-source current path. In conventional drain-extended LDMOS devices, the Rdson and breakdown voltage are thus generally inversely related, wherein the drain extension causes an increase in Rdson, thus limiting the drive current rating of the device.

Another ongoing trend involves scaling or reducing the size of semiconductor devices. For LDMOS transistors, the tradeoffs between Rdson and BVdss present challenges to scaling efforts, particularly where the design specifications for breakdown voltage and current carrying capability remain the same or increase. Thus, there remains a need for improved MOS transistor devices and manufacturing techniques for scaling LDMOS and other extended-drain transistor devices and for reducing on-state resistance Rdson without significantly impacting breakdown voltage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

According to one aspect of the invention, methods are provided for fabricating LDMOS or other extended drain MOS transistors, wherein a source and a drain of a first conductivity type are formed in a substrate, such as a bulk semiconductor or SOI wafer. A gate structure is formed over a channel of a second opposite conductivity type, wherein the gate structure comprises a thick dielectric, a thin dielectric, and a conductive gate contact structure. The thick dielectric comprises a first end adjacent the drain and comprises a second opposite end that extends laterally toward the source. The thin dielectric extends over the substrate from the second end of the thick dielectric to the source, where the conductive gate contact structure extends over the thin dielectric and over a portion of the thick dielectric. The method further comprises increasing a concentration of dopants of the first conductivity type in an adjust region of the substrate proximate the second end of the thick dielectric at the transition between the thin and thick dielectrics. The inventor has found that this localized increase in dopants operates to reduce or inhibit current flow constriction as electrons move from the source to the drain at the transition from the thin dielectric to the thick dielectric, thereby reducing on-state resistance (e g., Rdson) without significant adverse impact to the breakdown voltage performance (e.g., BVdss) of the resulting transistor.

The increased dopants in the local adjust region may be provided by implantation, for example, prior to forming the thick dielectric. In the case of field oxide dielectric structures used to form the thick gate dielectric, the localized implant may be performed prior to formation of a pad oxide layer and a nitride layer used to form the thick gate dielectric portion and field oxide isolation structures via local oxidation of silicon (e.g., LOCOS). Where shallow trench isolation (STI) processing is used to form the thick dielectric, the additional dopants may be implanted locally along all or a portion of the trench sidewall nearest the channel prior to filling the trench with dielectric material. The methods of the invention may be used for fabricating improved LDMOS or other drain extended devices, whether PMOS and/or NMOS transistors, wherein the additional dopants in the adjust region are selected according to the type of transistor being constructed. For example, for an n-channel LDMOS device, the first conductivity type is n-type and the second conductivity type is p-type, wherein the adjust region is provided with additional n-type impurities such as arsenic and/or phosphorus. In one example, the additional dopant implant operation may be performed at an angle to form the adjust region.

In another aspect of the invention, transistor devices are provided, comprising a source and a drain of a first conductivity type formed in a substrate, where the drain is formed in a first well of the first conductivity type in the substrate and the source is formed in a second well of a second opposite conductivity type. The transistor further includes a gate structure disposed over a channel in the substrate, comprising a thick dielectric having a first end adjacent the drain and a second opposite end extending laterally toward the source, as well as a thin dielectric extending over the substrate from the second end of the thick dielectric to the source. The first well has a concentration of dopants of the first conductivity type less than or equal to a first concentration value proximate the second end of the thick dielectric. A conductive gate contact structure is provided over the thin dielectric and over a portion of the thick dielectric. An adjust region of the first conductivity type is formed in the substrate proximate the second end of the thick dielectric, in which the adjust region has a concentration of dopants of the first conductivity type greater than or equal to a second concentration value, wherein the second concentration value is greater than the first concentration value.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
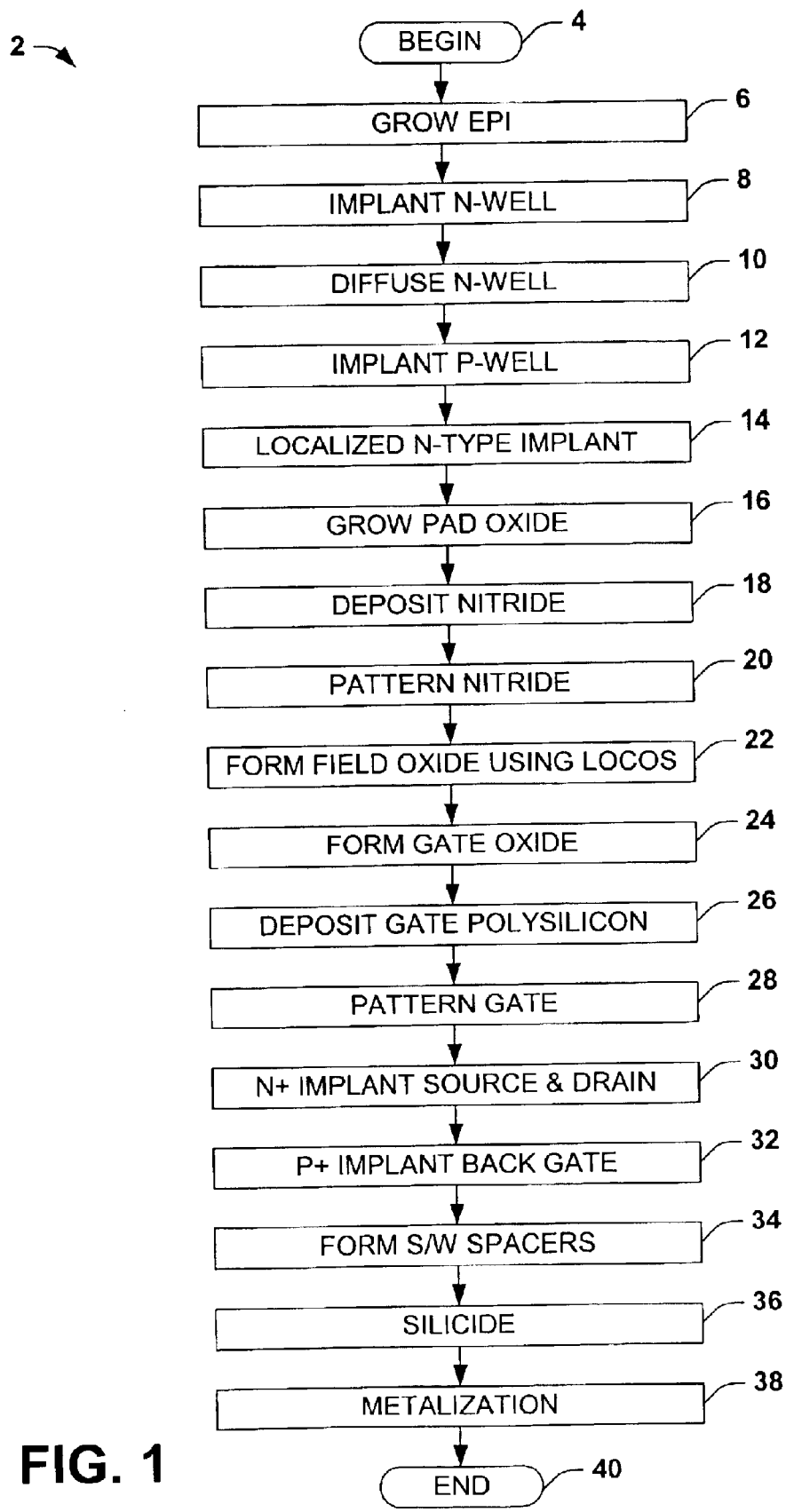
FIG. 1 is a flow diagram illustrating an exemplary method of fabricating an LDMOS transistor in which LOCOS field oxidation is used to form a thick dielectric portion of the gate structure in accordance with an aspect of the invention.

One or more implementations of the present invention will now be described with reference to the attached drawings, wherein like reference numerals are used to refer to like elements throughout. The invention provides for addition of extra dopants to a localized region of an LDMOS or other drain-extended MOS transistor to reduce on-state resistance (Rdson) without adversely impacting device breakdown voltage, which may be implemented in association with PMOS or NMOS type extended drain transistors. In the examples below, the various aspects of the invention are illustrated and described with respect to exemplary n-channel LDMOS type transistors fabricated using p-type silicon substrates with a p-type epitaxial layer formed thereover. However, the invention is not limited to the illustrated examples, wherein NMOS or PMOS transistors may be fabricated using any type of substrate, including but not limited to silicon or SOI wafers, and wherein all such variants are contemplated as falling within the scope of the invention and the appended claims. In addition, it is noted that the various structures illustrated herein are not necessarily drawn to scale.

Figure 5A:
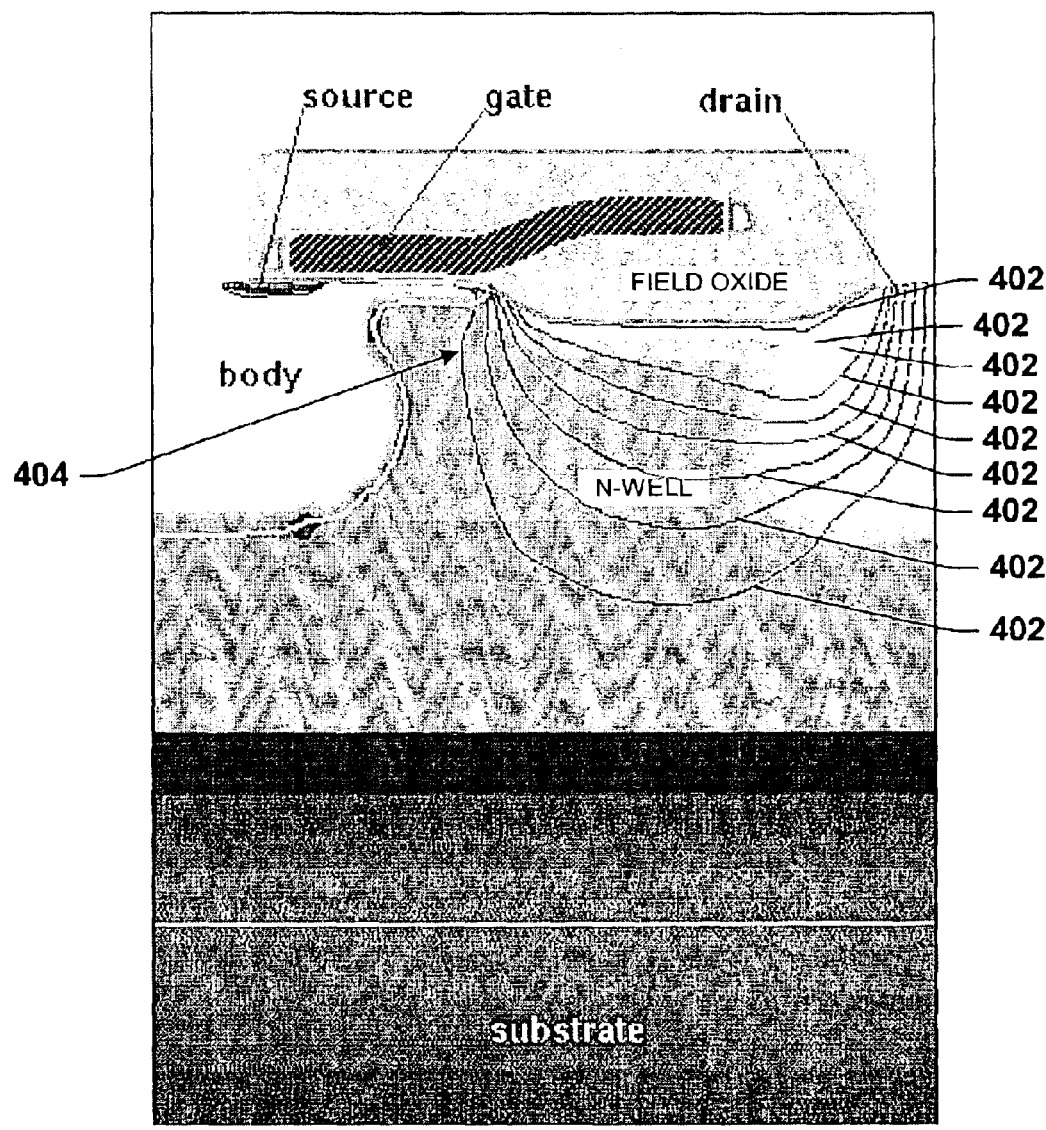
FIGS. 5A and 5B are partial side elevation views in section illustrating current flow in n-channel LDMOS transistors formed using LOCOS and STI techniques, respectively.
Figure 5B:
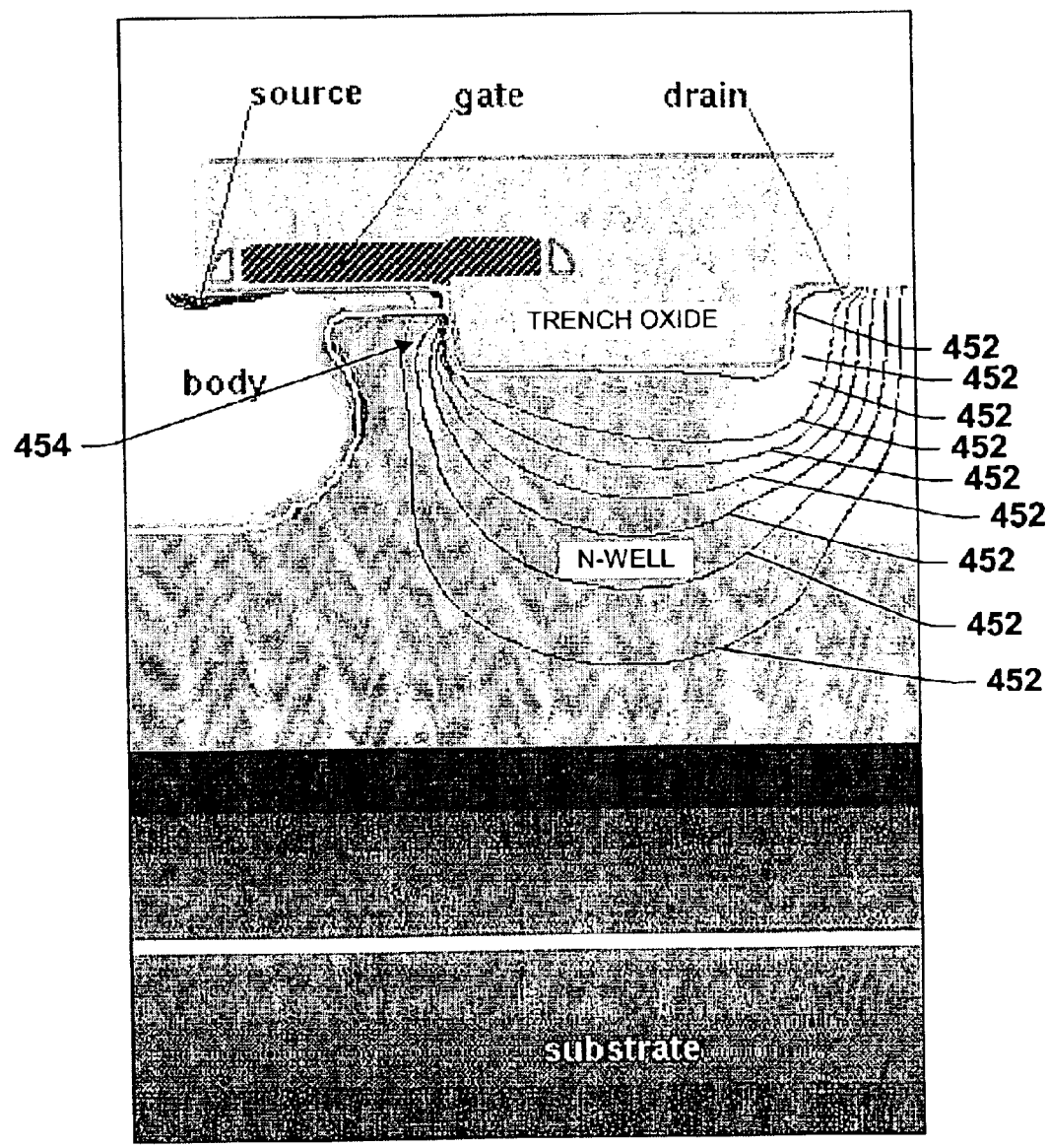

Referring initially to FIGS. 5A and 5B, side sectional views 400 and 450 are illustrated for n-channel LDMOS transistors formed using LOCOS and STI techniques, in which simulated on-state current flow lines 402 and 452 are illustrated, respectively. The inventor has found that in both illustrated examples, current constriction is seen in regions 404 and 454, respectively, at the channel-side end of the thick dielectric portion (field oxide or STI structure) under the gate contact. In addition, the inventor has appreciated that this current constriction adversely impacts the on-state resistance Rdson between the source and drain in LDMOS and other extended drain transistors. The on-state resistance of an LDMOS transistor directly affects the silicon area required in power integrated circuits, where the lower the on-state resistance, the smaller the LDMOS area can be made for a given current drive. Electrons flow from the source through the channel and into the drain extension (n-well region for an NMOS device), and finally to the drain, wherein the on-state resistance is distributed along this current flow path.

In an extended-drain LDMOS, field oxide (FOX) or deposited dielectric material may be provided in the drain extension region via LOCOS or STI processing, wherein the same process may be used to concurrently form dielectric isolation structures. As the feature sizes of semiconductor products continue to shrink, the "bird's beak" portion of the LOCOS field oxide becomes shorter and more abrupt with each generation of process technology, leading to the current flow constriction in the region 404 of FIG. 5A. In addition, where STI techniques are employed, the trench oxide sidewall is even more abrupt than that of a short bird's beak, as seen in FIG. 5B, leading to constriction of current flow in the region 454. The inventor has appreciated that the abrupt step at the channel-side end of the thick dielectric structure in an LDMOS drain extension region, whether field oxide or trench oxide, creates a significant resistance to the current flow, wherein the more abrupt such a step is, the more severe the current constriction. Although doping levels in the underlying well region may be adjusted to reduce the Rdson, simply changing this doping adversely reduces the device breakdown voltage rating.

By using the present invention, the current constriction may be reduced at or near such abrupt dielectric steps, whereby on-resistance may be reduced without significant adverse reduction in breakdown voltage for LDMOS and other extended-drain devices. In the case of n-channel LDMOS devices, an n-type dopant such as arsenic or phosphorus is locally implanted or otherwise provided into the region around the oxide step, referred to herein as an adjust region, wherein the implant dose and size of the implanted adjust region may be tailored such that there is no significant degradation in the breakdown voltage. The presence of additional dopants proximate the oxide step relieves the current constriction thereby reducing the on-state resistance Rdson. The invention further contemplates similar techniques for processing p-channel LDMOS devices, wherein additional p-type dopants (e.g., boron, etc.) are provided in an adjust region proximate the channel-side end of the thick dielectric structure.

An exemplary method 2 is illustrated in FIG. 1 for fabricating extended-drain transistors using LOCOS field oxidation processing, and an exemplary n-channel LDMOS transistor 102 is illustrated in FIGS. 2A–2H at various stages of fabrication in accordance with the invention. Although the exemplary method 2 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated. For example, the exemplary method 2 may be employed in fabricating an LDMOS transistor device 102 as illustrated and described below with respect to FIGS. 2A–2H.

The method 2 is illustrated for the case of an n-channel LDMOS device, such as the transistor 102 of FIGS. 2A–2H, although the invention is also applicable to fabricating p-channel LDMOS devices. Beginning at 4, an epitaxial layer is grown at 6 over a silicon substrate and n-type dopants (e.g., arsenic, phosphorus, and/or others) are selectively implanted at 8 into portions of the epitaxial layer to form n-well regions using a mask which exposes the prospective n-well regions and covers the remainder of the wafer. At 10, a thermal process is performed to diffuse the n-type dopants further into the epitaxial layer (e.g., and possibly into the underlying substrate), thereby extending the n-wells deeper below the wafer surface, for example, to about 4 um in one implementation. P-type dopants (e.g., boron, etc.) are implanted at 12 into prospective p-well regions using another mask, wherein a p-well is formed to provide a p-doped channel region for the N-type LDMOS within the previously formed n-well.

At 14 additional n-type dopants are provided in localized fashion to an adjust region of the wafer to increase the n-type dopant concentration therein. Any technique may be used to provide the additional dopants at 14 within the scope of the invention. In the exemplary device 102 of FIGS. 2A–2H, arsenic and/or phosphorus are implanted into the adjust regions using a mask exposing a portion of the n-well region, wherein any suitable dopants, implantation energies, and dose may be employed to provide n-type dopants in the adjust region at a higher concentration than the pre-existing n-well concentration. Further, the n-type dopants may be implanted at an angle within the scope of the invention, to allow tailoring of the location and shape of the adjust region. In one particular example, arsenic is implanted at 14 using a dose of about $5E12\ cm^{-2}$ at an implantation energy of about 160 keV to provide a shallow adjust region extending below the wafer surface by about 0.2 to 0.4 um. Following the localized n-type implant, the mask is removed using any suitable cleaning techniques.

A pad oxide layer is then formed over the wafer at 16, which may be deposited or thermally grown using any appropriate oxide formation techniques and a nitride layer is deposited and patterned at 18 and 20, respectively, to provide an oxidation mask covering prospective active regions and exposing prospective isolation or field regions of the wafer. The nitride mask also exposes a portion of the n-well region near the n-doped adjust region to allow subsequent formation of a thick dielectric for the LDMOS gate structure. At 22, a LOCOS process is performed to form thick field oxide dielectric material, which extends laterally from a first end adjacent a prospective drain region of the LDMOS to a second opposite end in the n-well. The thick field oxide dielectric also extends downward from the wafer surface into the n-well and above the surface, for example, having a total thickness of about 5200 Å in one example. The LOCOS process also operates to diffuse the p-type dopants in the p-well region deeper into the wafer, for example, to a depth of about 1.5 um. Although the exemplary method 2 provides field oxide dielectric for the thick dielectric of the LDMOS gate structure, any dielectric material may be used within the scope of the invention. Following the LOCOS processing, the nitride mask and the pad oxide are removed.

A thin gate oxide is formed over the wafer surface at 24, for example, by thermal oxidation processing, and a gate polysilicon layer is deposited at 26. The thin gate oxide and polysilicon are then patterned at 28 to form a gate structure, wherein the thin gate dielectric extends from the second end of the thick dielectric to a prospective source in the p-well. A source/drain implant is selectively performed at 30 to provide n-doped source and drain regions in the wafer, wherein the source is formed in the p-well and the drain is formed in the n-well at the first end of the thick dielectric. A back-gate contact region of the p-well is then implanted at 32, wherein appropriate masks are used for the implantations at 30 and 32. Sidewall spacers are then formed at 34 along the lateral ends of the gate structure, and further source/drain implants (not shown) may thereafter be performed before silicide and metalization processing at 36 and 38, respectively, whereafter the method 2 ends at 40.

Figure 2A:
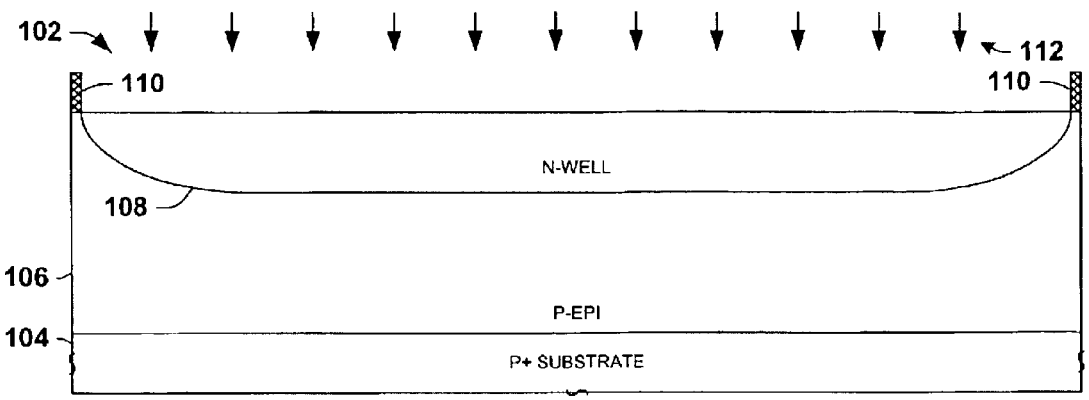
FIGS. 2A–2H are partial side elevation views in section illustrating an exemplary n-channel LDMOS transistor at various stages of fabrication in accordance with the invention.
Figure 2B:
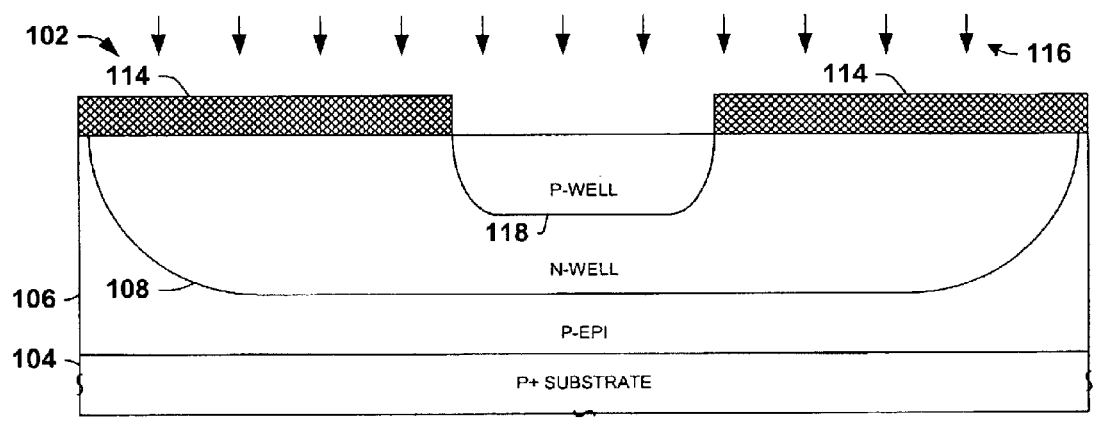
Figure 2C:
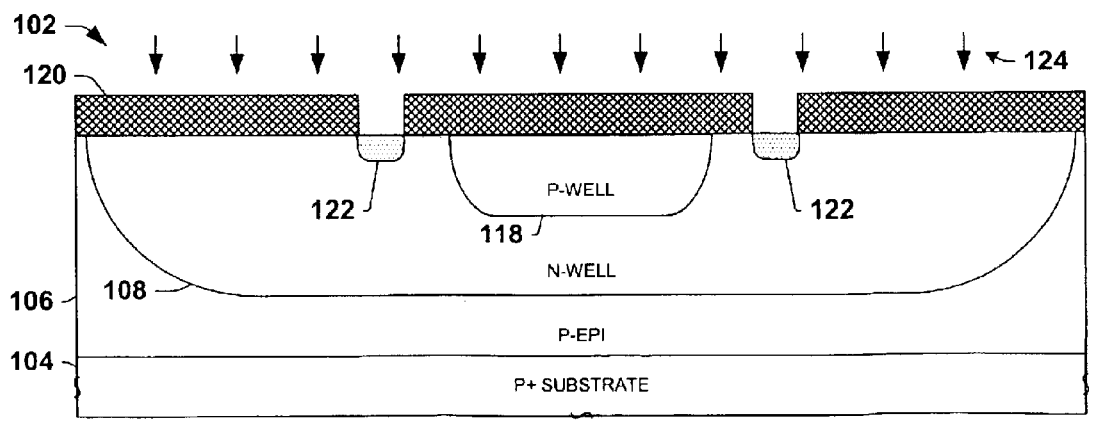

Referring also to FIGS. 2A–2H, an exemplary n-channel LDMOS transistor device 102 is illustrated undergoing fabrication processing according to the invention, wherein two transistors are formed which share a common source/back gate connection in the illustrated example, and wherein the structures are not necessarily drawn to scale. The device 102 comprises a P+ silicon substrate 104 over which a p-type epitaxial layer 106 is formed to a thickness of about 4 um or greater. In FIG. 2A, an n-well 108 is implanted with n-type dopants using a mask 110 via an implantation process 112. The mask 110 is then removed and the n-well 108 is thermally diffused to a depth of about 4 um as shown in FIG. 2B. Another mask 114 is then formed and an implantation process 116 is performed to provide p-type dopants to a p-well 118 extending to a depth of about 1.5 um within the n-well 108. The mask 114 is then removed and a mask 120 is formed to expose prospective adjust regions 122 outlying the p-well 118, which are then implanted with n-type dopants using an implantation process 124 (e.g., referred to herein as an n-adjust implant), which may be performed normal to the wafer surface or at an angle thereto. In the illustrated example, arsenic is implanted using a dose of about $5E12\ cm^{-2}$ at an implantation energy of about 160 keV to create the adjust regions 122 extending below the wafer surface by about 0.2 to 0.4 um. However, other suitable implantation species, doses and energies may be employed and the depth of the adjust regions 122 may be tailored in specific implementations.

Figure 2D:
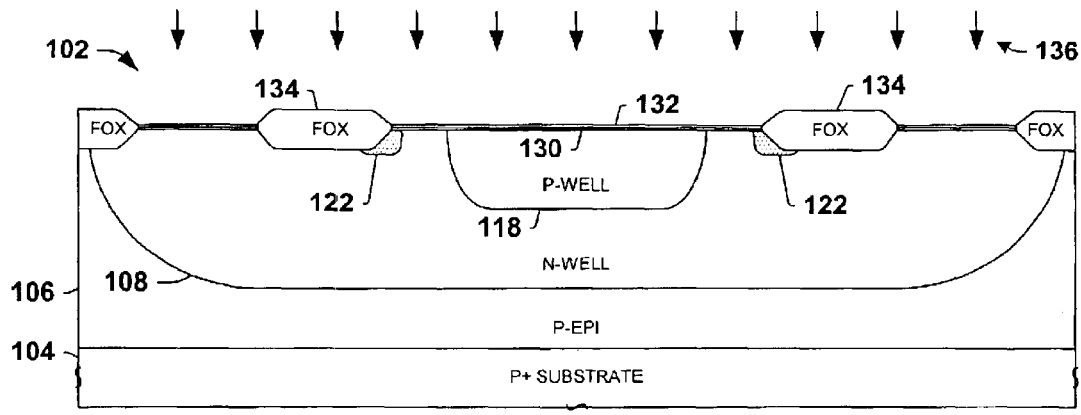

The mask 120 is removed and a pad oxide 130 is grown over the wafer surface, as shown in FIG. 2D. A nitride layer 132 is then deposited and patterned using suitable lithographic processing techniques, to expose prospective field regions and to cover prospective active regions of the wafer surface. A LOCOS process 136 is then employed to form thick dielectric field oxide (FOX) structures 134, which also diffuses the p-type dopants in the p-well 118 deeper. The field oxide 134 in the illustrated portion of the wafer provides a thick dielectric extending above and below the wafer surface by about 2600 Å in this example. The field oxide 134 is used in forming the LDMOS gate structures, while similar field oxide structures may be concurrently provided elsewhere in the wafer via the process 136 for device isolation. As illustrated in FIG. 2D, the adjust regions 122 provide enhanced n-type dopant concentration near one end of the thick dielectric 134 in accordance with the invention, wherein the dopant concentration in the adjust regions 122 is greater than that of other portions of the n-well 108 at similar depths. Following the field oxide formation, the nitride 132 and the pad oxide 130 are removed.

Figure 2E:
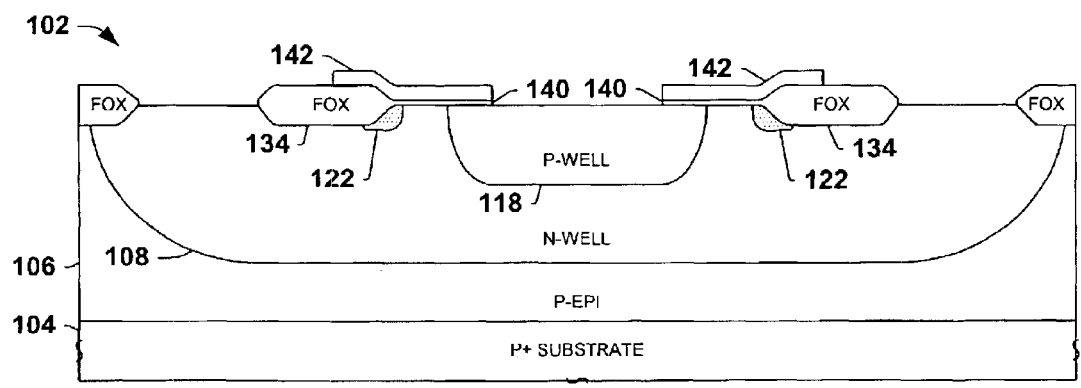
Figure 2F:
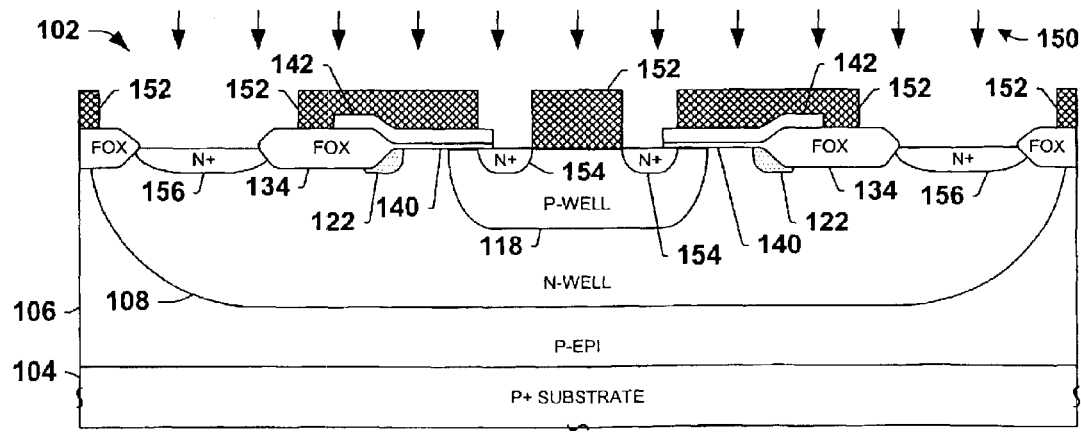
Figure 2G:
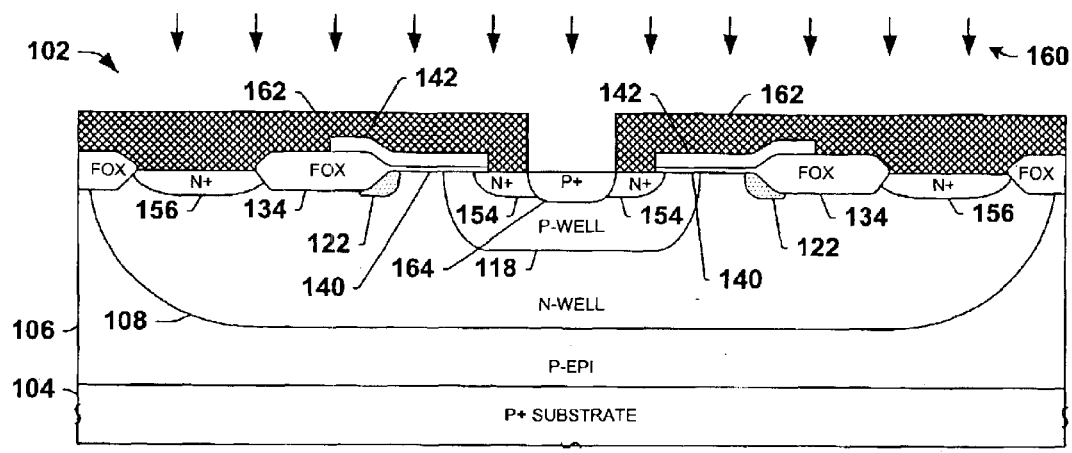

In FIG. 2E, the LDMOS gate structures are constructed, wherein a thin gate oxide layer 140 is grown over the wafer surface, and a layer of polysilicon 142 is then deposited. The thin gate oxide 140 and the polysilicon 142 are then patterned to define the gate structure, where the thin gate oxide 140 extends from the thick dielectric 134 to a prospective source in the p-well 118. In FIG. 2F, a source/drain implantation process 150 is employed with a mask 152 to implant n-type source and drain regions 154 and 156, respectively, in the wafer. The shared source 154 is formed in the p-well 118 and the drain 156 is formed in the n-well 108 at the first end of the thick dielectric 134. As illustrated in FIG. 2G, a p-type implantation process 160 is performed using another mask 162 to form a p-type back-gate contact region 164 in the p-well 118 disposed between ends of the source implant 154. Thereafter, back end processing is performed, including formation of sidewall spacers 170 at the ends of the gate structures, along with silicide processing to form conductive silicide 172 over the gate polysilicon 142, the sources 154, the back-gate contact 164, and the drains 156. An initial interlayer or inter-level dielectric (ILD) material 174 is deposited over the wafer and conductive contacts 178 (e.g., tungsten or other conductive material) are then formed through the dielectric 174 to couple with the silicided gate and drain terminals of the finished LDMOS transistors, as well as with the combined source/back-gate contacts.

Figure 2H:
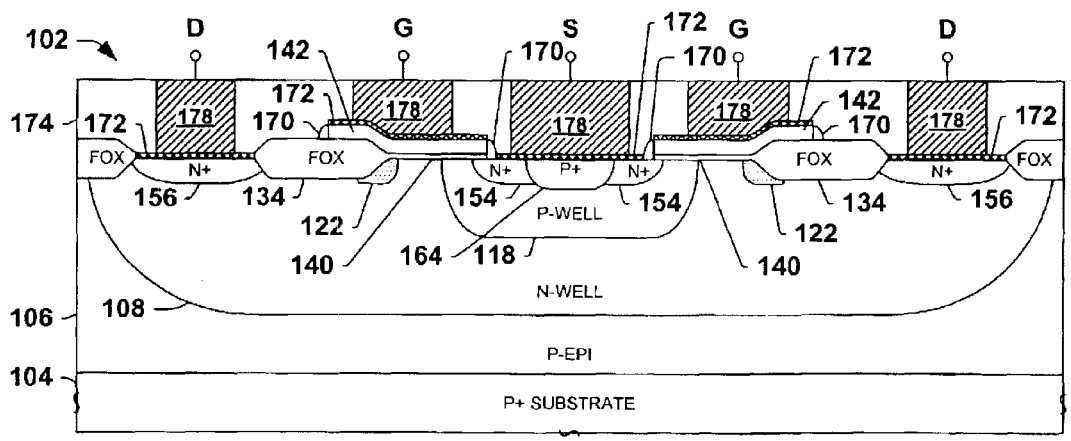

As shown in FIG. 2H, the resulting LDMOS transistors include n-doped drain regions through which electrons flow from the source 154 and the channel region underlying the thin gate oxide 140. The inventor has appreciated that the provision of a higher dopant concentration in the adjust regions 122 proximate the end of the thick dielectric 134 near the transition from the thin dielectric 140 reduces the resistance to electrons flowing from the channel toward the drain 156 (e.g., reduces Rdson), without significantly impacting the breakdown voltage of the LDMOS. While not wishing to be tied to any particular theory, it is believed that providing a higher concentration of n-type dopants in the regions 122 reduces the current flow constriction in the regions 404 and 454 exemplified in FIGS. 5A and 5B, respectively. At the same time, the localized provision of such enhanced doping minimizes the impact on voltage breakdown. Thus, the invention has been found to provide Rdson improvements without significant tradeoff in breakdown voltage rating for a given design. In one example, with an n-well dopant concentration of about 2E16 cm$^{-3}$ and an adjust region n-type dopant concentration of about 1E18 cm$^{-3}$, the transistor mean on-resistance (Rdson) was found to improve from 112.4 OHMS without the additional adjust region doping to about 90.8 OHMS with the additional doping, wherein the mean breakdown voltage remained at about 59.2 volts in both cases. These results are believed to exemplify advantages obtainable using the invention, wherein similar results are expected in the case of p-channel LDMOS transistors, with n-doped regions being replaced by p-doped regions and vice-versa, as well as other extended drain devices.

Figure 3:
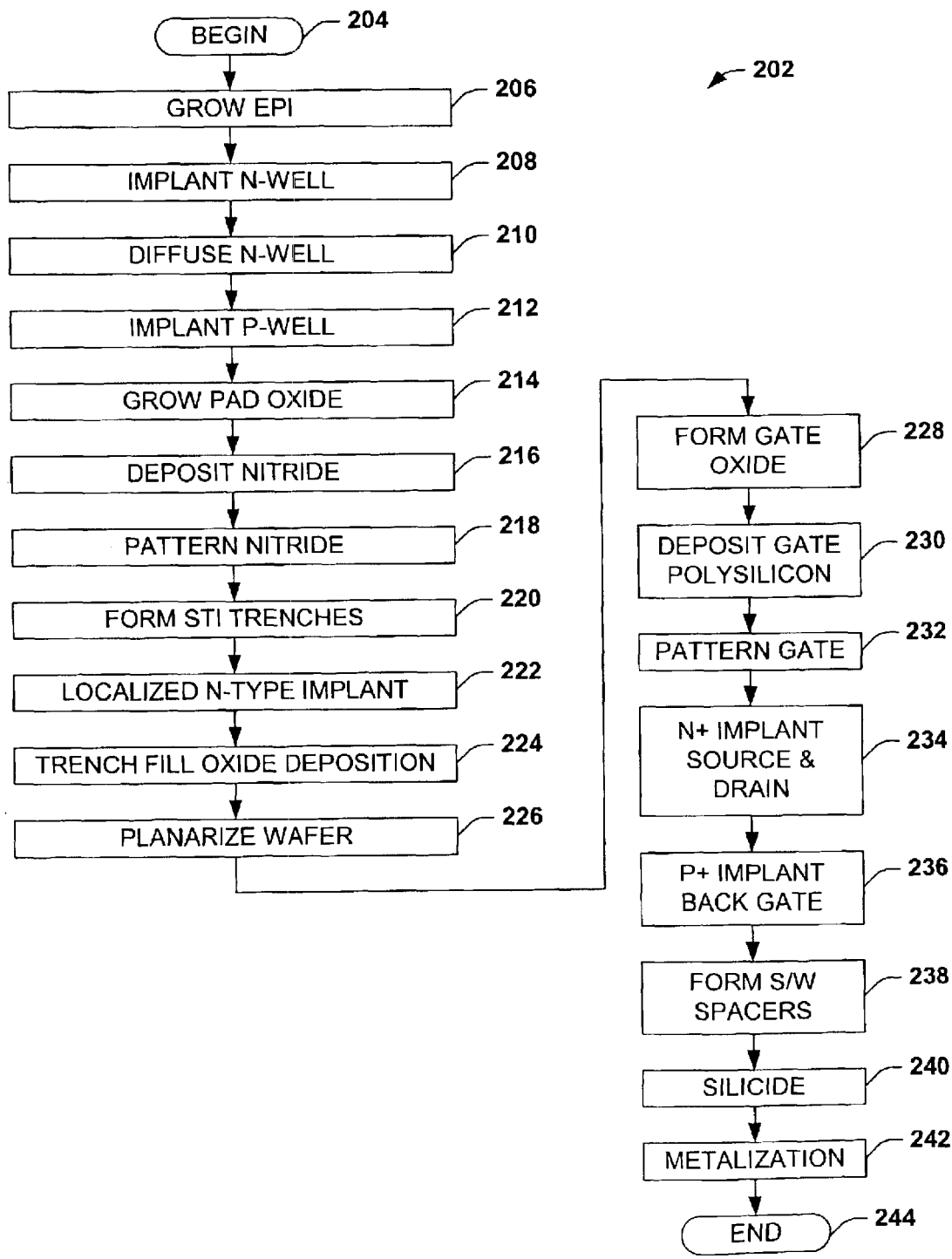
FIG. 3 is a flow diagram illustrating another exemplary method for fabricating an LDMOS transistor, wherein STI techniques are used to form the thick dielectric portion of the gate structure.

Referring now to FIGS. 3 and 4A–4I, the invention may also be employed in situations where shallow trench isolation (STI) techniques are used to form the thick dielectric portion of the gate structure in an LDMOS or other extended drain transistor. FIG. 3 illustrates another exemplary method 202 of fabricating transistors in accordance with the current invention, which is illustrated for the case of n-channel LDMOS devices. As with the above examples, the invention may also be employed in fabricating p-channel LDMOS transistors in which STI techniques are used. Beginning at 204, the method 202 comprises growing an epitaxial layer over a silicon substrate at 206, implanting and diffusing an n-well at 208 and 210, respectively, and implanting a p-well at 212, which may be done in the same fashion described above. At 214–218, a pad oxide layer and a nitride layer are formed over the wafer and the nitride is patterned to cover active regions and expose field regions of the wafer.

At 220, STI trenches are formed by etching cavities into the wafer using the nitride as an etch mask, wherein any suitable etch processes and/or chemistries may be employed in accordance with the invention. As with the above LOCOS example of FIGS. 1 and 2A–2H, the STI trenches are located in isolation regions between adjacent devices and also in areas where thick dielectric material is to be used in constructing LDMOS transistors. As illustrated and described above with respect to FIG. 5B, absent the present invention, current constriction occurs near the STI sidewall during LDMOS operation, which results in resistance to current flow between the channel and the extended drain. To combat this on-state resistance, a localized n-type implantation is performed at 222 to increase the n-type dopant concentration in an adjust region proximate all or a portion of the trench sidewall nearest the prospective channel region, using appropriate masking and implantation parameters. In one implementation illustrated in FIGS. 4A–4I, the adjust region is implanted using a dose of about 5E12 cm$^{-2}$ at an implantation energy of about 160 keV to increase the dopant concentration in an adjust region extending below the wafer surface by about 0.2 to 0.4 um. In one variation, the implantation at 222 may be performed at an angle to ensure adequate additional doping along the trench sidewall.

Thereafter at 224, the trench is filled with dielectric material, such as by depositing SiO$_2$ or other dielectric into the trenches and over the remainder of the wafer. The wafer is then planarized at 226, such as by chemical mechanical polishing (CMP) or other suitable processes to remove the dielectric from the active regions of the wafer, leaving the trenches filled with oxide. A thin gate oxide is then formed over the wafer surface at 228 by thermal oxidation or other techniques, and a gate polysilicon layer is deposited over the wafer at 230. The gate oxide and polysilicon are patterned at 232 to form a gate structure, and n-type source/drain implants are performed at 234 to form a source in the p-well and a drain in the n-well at a first end of the thick (STI) dielectric of the LDMOS. A p-type implant is then selectively performed at 236 to form a back-gate contact region in the p-well, sidewall spacers are formed at 238 along the lateral ends of the gate structure, and silicide and metalization processing are performed at 240 and 242, respectively, before the method 202 ends at 244.

Figure 4A:
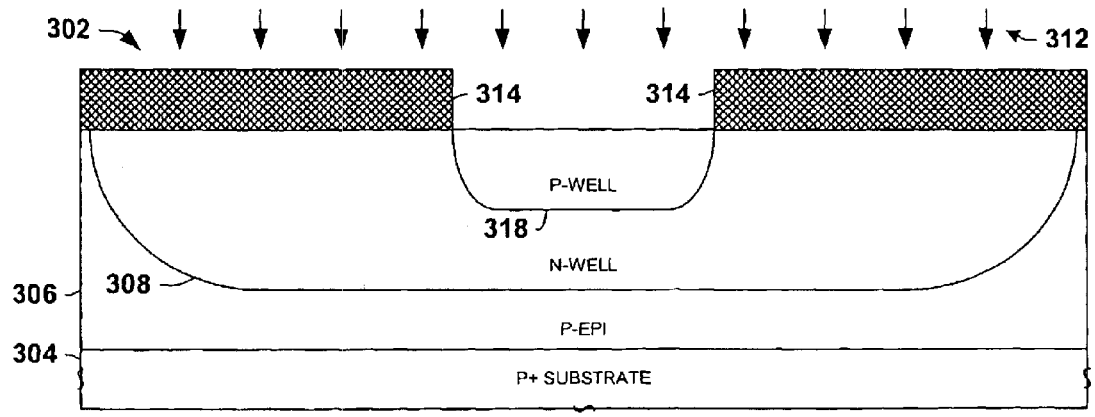
FIGS. 4A–4I are partial side elevation views in section illustrating another exemplary n-channel LDMOS transistor at various stages of fabrication in accordance with the invention.
Figure 4B:
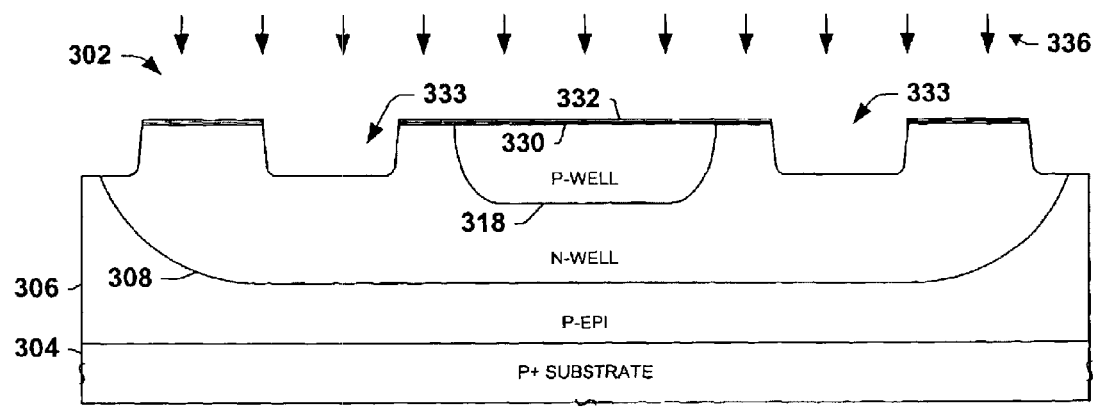

An exemplary n-channel LDMOS transistor 302 is illustrated in FIGS. 4A–4I undergoing fabrication processing generally in accordance with the method 202, wherein STI structures are used to form a thick dielectric of the gate structure. As illustrated in FIG. 4A, the device 302 comprises a P+ silicon substrate 304 over which a p-type epitaxial layer 306 is formed to a thickness of about 4 um or greater. An n-well 308 is implanted with n-type dopants which are then diffused to a depth of about 4 um, and an implantation process 312 is performed using a mask 314 to provide p-type dopants to a p-well 318 extending to a depth of about 1.5 um within the n-well 308. The mask 314 is removed and a pad oxide 330 is grown over the wafer surface, as shown in FIG. 4B. A nitride layer 332 is then deposited and patterned to expose prospective field regions and to cover prospective active regions of the wafer surface. An etch process 336 is then employed to form trenches 333 in the exposed portions of the wafer, including portions of the n-well 308 in which a thick dielectric is to be formed for the LDMOS gate structure. The trenches 333 may be etched to any desired depth, such as about 0.5 um in the illustrated example, after which the nitride 332 and the pad oxide 330 are removed.

Figure 4C:
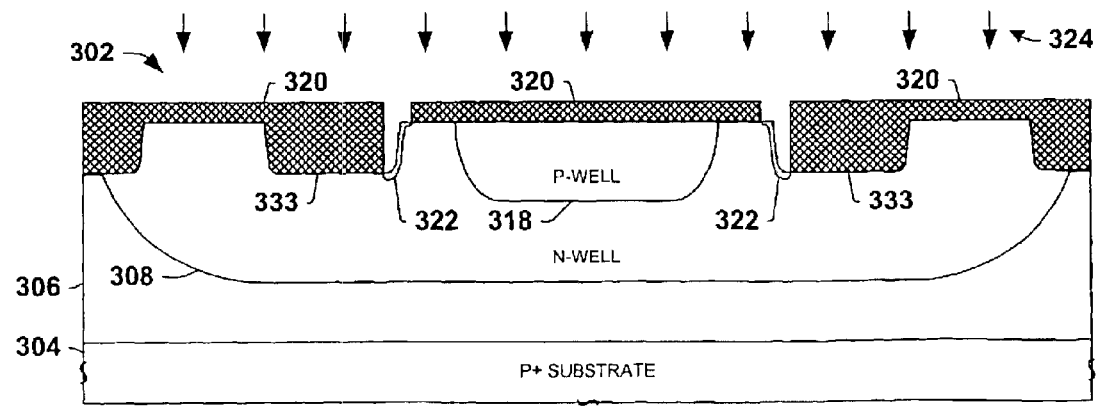
Figure 4D:
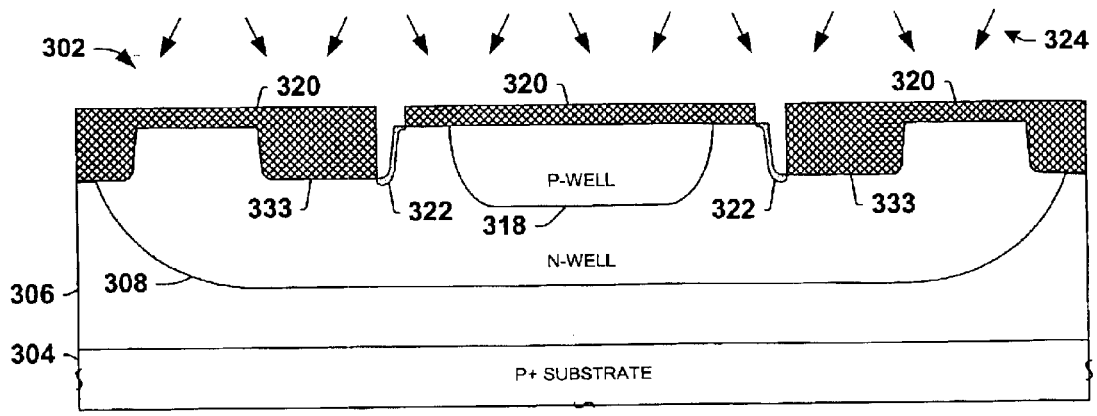

In order to provide additional dopants to portions of the n-well near the trench sidewalls, a mask 320 is formed in FIG. 4C to expose prospective adjust regions 322 outlying the p-well 318. An implantation process 324 (e.g., an n-adjust implant) is performed to provide extra n-type dopants to the regions 322, wherein the implantation process 324 may be an angled implant (FIG. 4D). In the exemplary device 302, arsenic is implanted via the process 324 using a dose of about 5E12 cm$^{-2}$ at an energy of about 160 keV. The implantation 324 provides the adjust regions 322 extending below the wafer surface by about 0.2 to 0.4 um, and along all or a portion of the sidewalls of the trenches 333 nearest the prospective channel regions, having a higher n-type dopant concentration than that of the n-well 308 at corresponding depths. Other suitable implantation species, doses, and energies may be employed and the depth and profile of the adjust regions 322 may be tailored in specific implementations to improve on-state resistance in the resulting LDMOS devices without significant adverse impact on breakdown voltage.

Figure 4E:
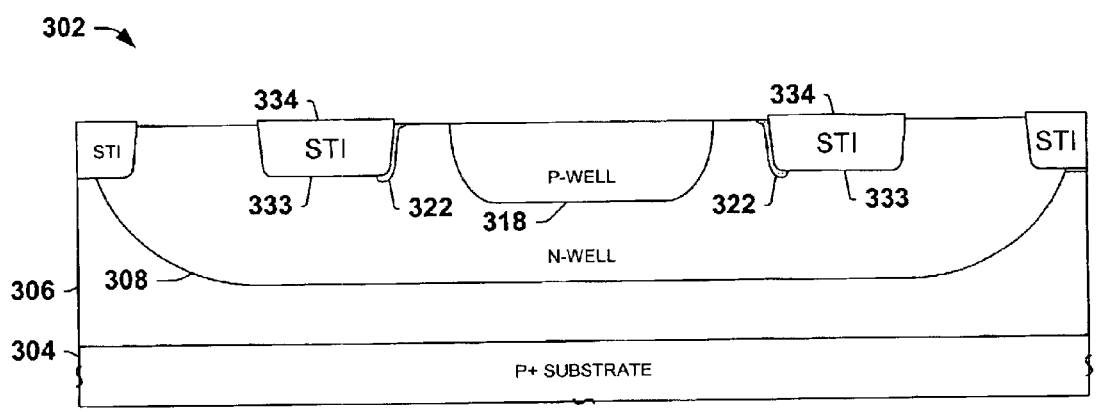
Figure 4F:
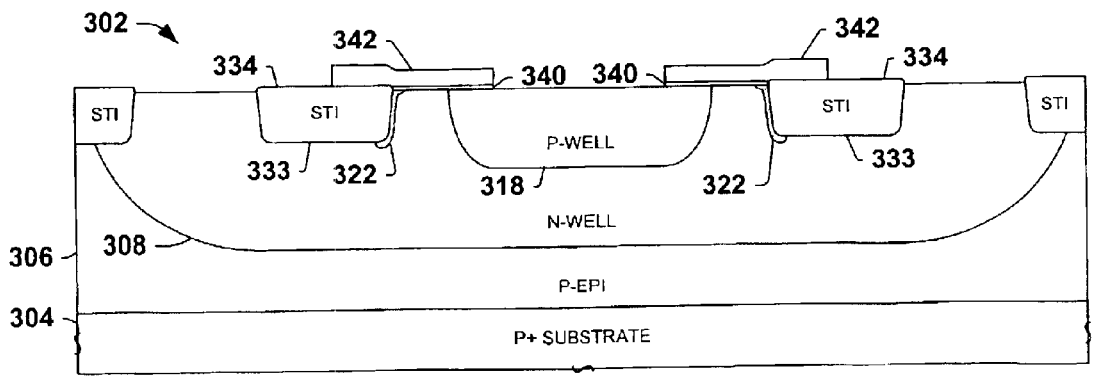
Figure 4G:
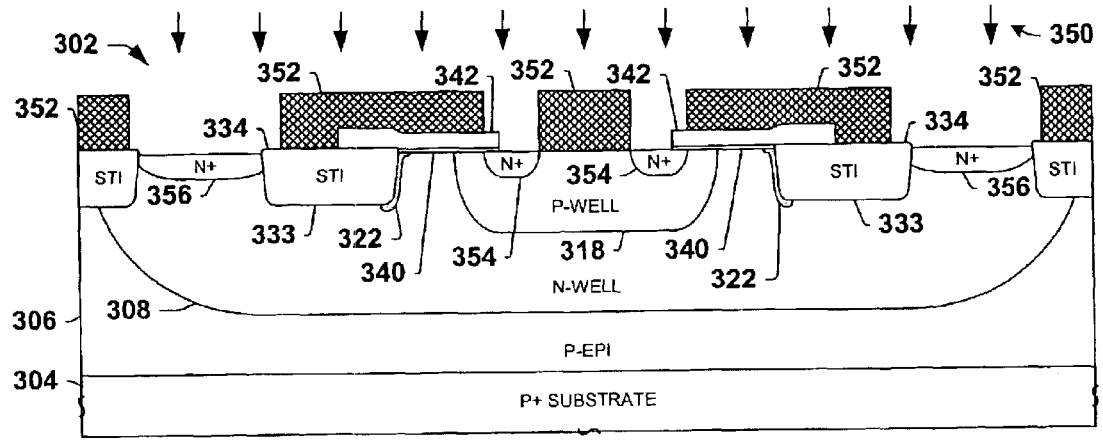
Figure 4H:
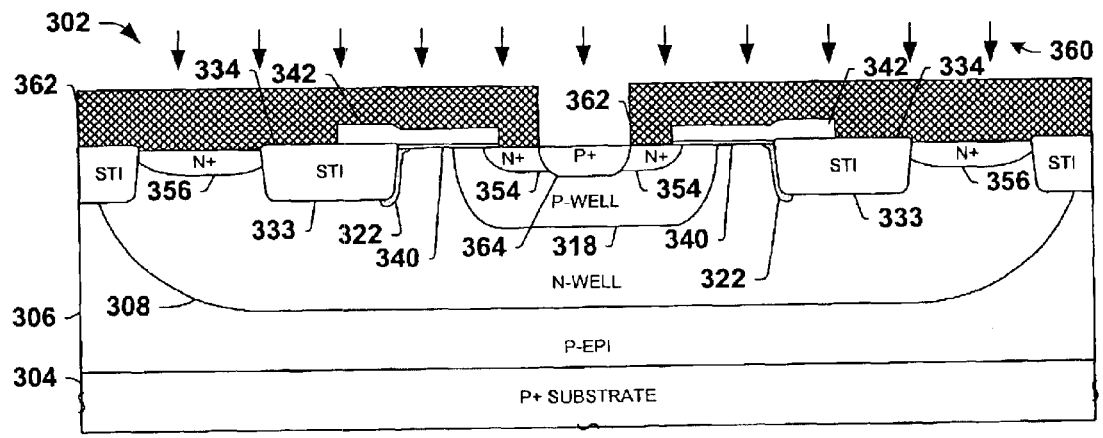
Figure 4I:
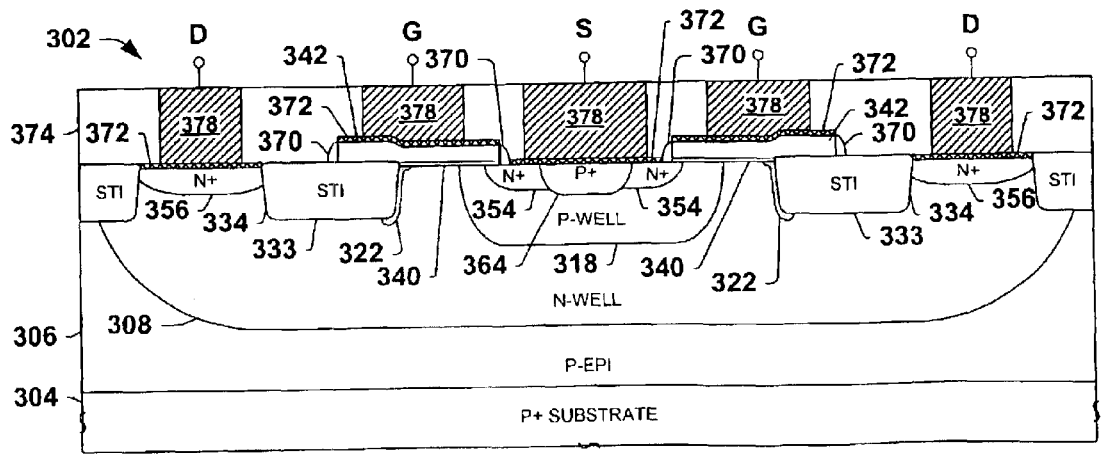

The trenches 333 are then filled with dielectric material, such as SiO$_2$ or other dielectric material, by depositing a dielectric layer to cover the entire wafer and to fill the trenches 333. The wafer is then planarized, for example, using a CMP process to leave active regions of the wafer exposed, with the remaining deposited dielectric forming STI dielectric structures 334, as shown in FIG. 4E. In FIG. 4F, gate structures are constructed for the LDMOS device, comprising a thin gate oxide layer 340 grown over the wafer surface, and a layer of polysilicon 342 deposited over the gate oxide and the STI structures 334. The thin gate oxide 340 and the polysilicon 342 are then patterned to define the gate structure, where the thin gate oxide 340 extends from the thick dielectric 334 to a prospective source in the p-well 318. A mask 352 is then formed in FIG. 4G and a source/drain implantation process 350 is employed to provide n-type source and drain regions 354 and 356, respectively, where a shared source 354 is formed in the p-well 318 and the drains 356 are formed in the n-well 308 at the first ends of the STI structures 334. The mask 352 is removed and another mask 362 is formed in FIG. 4H for implanting a p-type back-gate contact region 364 in the p-well 318 disposed between ends of the source implant 354 using an implantation process 360. Back end processing is performed in FIG. 4I to form sidewall spacers 370 at the ends of the gate structures, along with silicide processing to form conductive silicide 372 over the gate polysilicon 342, the sources 354, the back-gate contact 364, and the drains 356.

An ILD material 374 is deposited over the wafer and conductive contacts 378 are then formed through the dielectric 374 to couple with the silicided gate and drain terminals of the finished LDMOS transistors, as well as the combined source/back-gate contacts. The resulting LDMOS devices thus include n-doped drain regions through which electrons flow from the source 354 and the channel region underlying the thin gate oxide 340, wherein the higher dopant concentration in the adjust regions 322 reduces the on-state resistance, without significantly impacting the breakdown voltage. As with the above examples, similar results are possible for extended-drain PMOS transistors, wherein n-doped regions are replaced with p-doped regions and vice-versa.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating an extended drain MOS transistor, comprising:

forming a first well of a first conductivity type in a substrate;

forming a second well of a second conductivity type in the substrate, the first and second conductivity types being opposite;

forming a drain of the first conductivity type in a portion of the first well;

forming a source of the first conductivity type in a portion of the second well;

forming a thick dielectric extending laterally from a first end adjacent the drain to a second opposite end in the first well, the thick dielectric extending into the first well of the substrate, wherein the first well has a concentration of dopants of the first conductivity type less than or equal to a first concentration value proximate the second end of the thick dielectric;

forming a thin dielectric over the substrate, the thin dielectric extending from the second end of the thick dielectric in the first well to the source in the second well;

forming a conductive gate contact structure extending over the thin dielectric and over a portion of the thick dielectric; and implanting additional dopants of the first conductivity type at a second concentration value in an adjust region of the substrate proximate the second end of the thick dielectric, the second concentration value being greater than the first concentration value;

wherein the transistor is fabricated in a wafer, wherein forming the thick dielectric comprises:
   forming a trench extending into the substrate in the first well;
   depositing dielectric material into the trench and over the wafer;
   planarizing the wafer; and
   wherein the additional dopants of the first conductivity type are provided in the adjust region after forming the trench and prior to depositing dielectric material into the trench.

2. The method of claim 1, wherein the first conductivity type is n-type and the second conductivity type is p-type.

3. The method of claim 2, wherein implanting additional dopants comprises implanting arsenic into the adjust region using a dose of about $5E12\ cm^{-2}$ and an energy of about 160 keV.

4. The method of claim 1, wherein implanting additional dopants comprises performing an angled implantation process.

5. The method of claim 1, wherein providing additional dopants of the first conductivity type in the adjust region is done prior to forming the thick dielectric.

6. The method of claim 1, wherein forming the thick dielectric comprises oxidizing a portion of the substrate material to form the thick dielectric using a LOCOS process after providing additional dopants of the first conductivity type in the adjust region.

7. A method of fabricating an extended drain MOS transistor, comprising:
   forming a source and a drain in a substrate, the source and drain being of a first conductivity type;
   forming a gate structure over a channel of a second opposite conductivity type in the substrate, the gate structure comprising:
      a thick dielectric having a first end adjacent the drain and extending laterally toward the source to a second opposite end, the thick dielectric extending into the substrate;
      a thin dielectric extending over the substrate from the second end of the thick dielectric to the source; and
      a conductive gate contact structure extending over the thin dielectric and over a portion of the thick dielectric; and
   increasing a concentration of dopants of the first conductivity type in an adjust region of the substrate proximate the second end of the thick dielectric;
   wherein increasing the concentration of dopants of the first conductivity type in the adjust region comprises implanting additional dopants of the first conductivity type into the adjust region using an angled implantation process.

8. The method of claim 7, wherein forming gate structure comprises oxidizing a portion of the substrate material to form the thick dielectric using a LOCOS process.

9. The method of claim 8, wherein increasing the concentration of dopants of the first conductivity type in the adjust region comprises implanting additional dopants of the first conductivity type into the adjust region prior to forming the thick dielectric.

10. The method of claim 7, wherein the transistor is fabricated in a wafer, wherein forming the gate structure comprises:
   forming a trench extending into the substrate;
   depositing dielectric material into the trench and over the wafer; and
   planarizing the wafer.

11. The method of claim 10, wherein increasing the concentration of dopants of the first conductivity type in the adjust region comprises implanting additional dopants of the first conductivity type into the adjust region after forming the trench and prior to depositing dielectric material into the trench.

12. A method of fabricating an extended drain MOS transistor, comprising:
   forming a source and a drain in a substrate, the source and drain being of a first conductivity type;
   forming a gate structure over a channel of a second opposite conductivity type in the substrate, the gate structure comprising:
      a thick dielectric having a first end adjacent the drain and extending laterally toward the source to a second opposite end, the thick dielectric extending into the substrate;
      a thin dielectric extending over the substrate from the second end of the thick dielectric to the source; and
      a conductive gate contact structure extending over the thin dielectric and over portion of the thick dielectric; and
   increasing a concentration of dopants of the first conductivity type in an adjust region of the substrate proximate the second end of the thick dielectric, wherein increasing the concentration of dopants of the first conductivity type in the adjust region comprises implanting additional dopants of the first conductivity type into the adjust region prior to forming the gate structure.

\* \* \* \* \*